US009678111B2

(12) United States Patent
Liu et al.

(10) Patent No.: US 9,678,111 B2
(45) Date of Patent: Jun. 13, 2017

(54) CURRENT SENSING WITH COMPENSATION FOR COMPONENT VARIATIONS

(71) Applicant: NXP B.V., Eindhoven (NL)

(72) Inventors: Xiaoqun Liu, Chandler, AZ (US); Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/877,696

(22) Filed: Oct. 7, 2015

(65) Prior Publication Data

US 2017/0102413 A1 Apr. 13, 2017

(51) Int. Cl.

| | |
|---|---|
| ***G01R 1/20*** | (2006.01) |
| ***G01R 15/14*** | (2006.01) |
| ***H03K 3/011*** | (2006.01) |
| ***G01R 19/00*** | (2006.01) |
| ***G01R 19/32*** | (2006.01) |

(52) U.S. Cl.

CPC ....... *G01R 15/146* (2013.01); *G01R 19/0092* (2013.01); *G01R 19/32* (2013.01); *H03K 3/011* (2013.01)

(58) Field of Classification Search

CPC .. G01R 19/32; G01R 19/0092; G01R 15/146; H03K 3/011

USPC .................................... 324/126, 76.11, 76.74

See application file for complete search history.

(56) References Cited

U.S. PATENT DOCUMENTS 6,448,800 B1 * 9/2002 Yamamoto ....... G01R 31/31924 324/750.3
7,141,955 B1 11/2006 Martinez
2002/0093360 A1 * 7/2002 Nagata ............... G01R 31/2884 361/86
2006/0232266 A1 10/2006 Kelly
2006/0256492 A1 11/2006 Zhao et al.
2007/0064367 A1 3/2007 Yamada (Continued)

FOREIGN PATENT DOCUMENTS

DE 10219823 A1 11/2003
FR 2839365 A1 11/2003

(Continued)

OTHER PUBLICATIONS

"Universal Serial Bus Type-C Cable and Connector Specification" Revision 1.1 USB 3.0 Promoter group: Hewlett-Packard Company, Intel Corporation, Microsoft Corporation, Renesas, STMicroelectronics and Texas Instruments, Apr. 3, 2015.

*Primary Examiner* — Giovanni Astacio-Oquendo

(57) ABSTRACT

A system can provide current detection in an integrated circuit (IC) chip while compensating for variations in circuit components resulting from process, voltage supply, temperature, or combinations thereof. The system can include the IC chip that has a power switch circuit that includes a power circuit path including a first transistor connected to a power source through a first conductive trace that has a first resistance value, and to a load by a second conductive trace having a second resistance value. A current detection circuit is configured to compensate for the variations in the power switch circuit using a sense circuit path that is configured to match process, voltage supply, and temperature variations in the power circuit path.

17 Claims, 3 Drawing Sheets

(56) References Cited

U.S. PATENT DOCUMENTS

| | | | | |
|---|---|---|---|---|
| 2007/0188184 | A1* | 8/2007 | Athas | G01R 31/3004 324/750.3 |
| 2012/0313917 | A1* | 12/2012 | Yamada | G09G 3/3406 345/211 |
| 2013/0038361 | A1* | 2/2013 | Groot | H03K 19/0013 327/143 |
| 2013/0238273 | A1* | 9/2013 | Tercariol | G01R 19/0084 702/117 |
| 2014/0021983 | A1 | 1/2014 | Khayat et al. | |

FOREIGN PATENT DOCUMENTS

| | | |
|---|---|---|
| JP | 2004140423 | 5/2004 |
| JP | 2008234015 | 3/2007 |

* cited by examiner

CURRENT SENSING WITH COMPENSATION FOR COMPONENT VARIATIONS

OVERVIEW

Aspects of various embodiments are directed to providing current detection in an integrated circuit (IC) chip while compensating for variations in circuit components resulting from component variations.

Bus interface protocols can be designed to allow for power to be provided over wired interfaces. This power can be used, in some instances, to charge a battery, or similar self-contained power source, directly power a power-receiving (power-consuming) device, or both charge and directly power. Standards for bus interface protocols can sometimes provide for different power-sourcing capabilities between different power-consuming devices. For example, different power-consuming devices, each using the same wired interface can be configured to draw different amounts of current. Consistent with various aspects discussed herein, the power-consuming devices can be configured to communicate their power-sourcing capabilities to the power-providing device upon connection. In some instances, at least a portion of this communication may occur before a power-supply of the power-consuming device has reached a stable internal voltage. The ability to have different power supplying and sourcing capabilities can lead to a need for current detection and limiting capabilities.

A particular type of bus interface protocol is the Universal Serial Bus (USB). While USB can be used to attach external peripherals to a Personal Computer, it can also be used for interfacings between peripherals, charging thereof and a host of other applications and uses, such as automotive, cameras, smart phones, televisions, and set-top boxes. USB can also be used as a source of power in various mobile device charging solutions. USB provides various different data transfer speeds. For example, USB 3.0 provides data transfer speeds up to 5 Gbit/s and USB 3.1 provides data transfer rates of up to 10 Gbit/s. USB also provides various different power providing and sinking capabilities. USB Type-C can support 5V with 500 mA/900 mA (for USB 2.0/USB 3.1), 1.5 A and 3 A mode. The USB Power Delivery (PD) supports a power negotiation and delivery solution that supports up to 100 W (20V×5 A).

These and other matters have presented challenges to efficiencies of power delivery integrated circuits (ICs) and their implementations, for a variety of applications.

SUMMARY

Various embodiments are directed toward a system for providing current detection in an integrated circuit (IC) chip while compensating for variations in circuit components resulting from process, voltage supply, temperature, or combinations thereof. The system can include the IC chip which has a power switch circuit that includes a power circuit path including a first transistor connected to: a power source through a first conductive trace that has a first resistance value, and a load through a second conductive trace having a second resistance value. A current detection circuit is configured to compensate for the variations in the power switch circuit. The current detection circuit can include a current source circuit and a sense circuit path that is configured to match process, voltage supply, and temperature variations in the power circuit path. The sense circuit path can include a second transistor connected to the power source by a third conductive trace having a third resistance value and to the current source circuit by a fourth conductive trace having a fourth resistance value. A comparator circuit can be configured to compare a voltage drop across the power circuit path to a voltage drop across the sense circuit path and, in response to the comparison, provide a data signal to an output of the current detection circuit.

According to some embodiments, a method provides current detection in an integrated circuit (IC) chip while compensating for variations in circuit components resulting from manufacturing of the IC chip. The method includes receiving power from a power source and routing the power through a power switch circuit that includes a power circuit path that includes a first transistor connected to a power source by a first conductive trace having a first resistance value and to a load by a second conductive trace having a second resistance value. A reference voltage can be generated by routing current from a current source circuit through a sense circuit path that is configured to match at least one component variation selected from the group consisting of process variation, supply voltage variation and temperature variation for components in the power circuit path. The sense circuit path also includes a second transistor connected to the power source by a third conductive trace having a third resistance value and to the current source circuit by a fourth conductive trace having a fourth resistance value. A voltage drop across the power circuit path can be compared to a voltage drop across the sense circuit path. In response to the comparison, a data signal can be provided that indicates a current level through the power circuit path.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
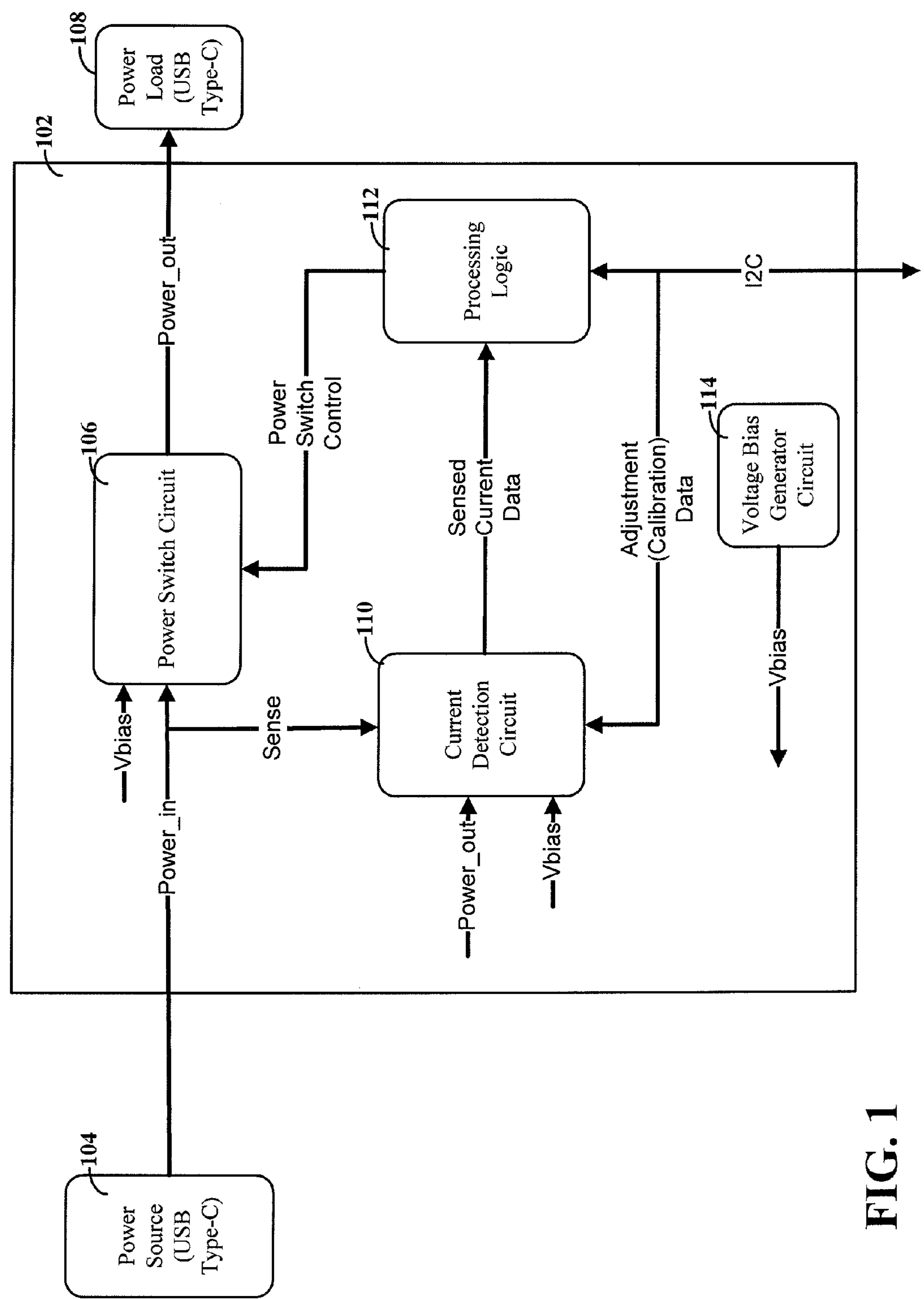
FIG. 1 depicts a block diagram of a system that includes an IC chip for detecting current levels, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving matching of component variations in an IC. In certain implementations, aspects of the present disclosure have been shown to be beneficial when used in the context of current detection and limiting. In some embodiments, the current detection and limiting is relative to power provided using a USB interface. These and other aspects can be implemented to address challenges, including those discussed in the background above. While not necessarily so limited, various aspects may be appreciated through a discussion of examples using such exemplary contexts.

Various embodiments of the present disclosure are directed toward a system for providing current detection in an integrated circuit (IC) chip while compensating for variations in circuit components. Particular embodiments are directed toward a Universal Serial Bus (USB) Type-C application, however, the various embodiments discussed herein are not necessarily so limited. In some instances, the component variations can include process, voltage and temperature (PVT) variation effects on on-chip interconnect as well as other variations. In certain embodiments, the IC chip can be configured to control the flow of power from a power source to a load. The IC can be used to detect current through the IC by comparing current through two different current paths that have matched PVT variation effects. For instance, a power-providing path can include a number of components, including multiple conductive traces with resistance values and a power switch that includes a power transistor. A power sensing path can include a similar set of components that are subject to similar PVT variation effects as the power-providing path. A current sensing circuit can be configured to take measurements from each path such that PVT variation effects from each of the paths cancel each other out.

Particular embodiments are directed toward a first, power-providing path that includes a first transistor connected to a power source through a first conductive trace and to a load by a second conductive trace. A current-sense circuit path is configured with components that match PVT variation effects in the power circuit path. For instance, the sense circuit path includes a second transistor that is connected to the power source by a third conductive trace and to a current source circuit by a fourth conductive trace having a fourth resistance value. A current detection circuit can be configured to compensate for the variations in the power switch circuit by taking a ratio of voltages detected on each of the current-sense path and the power-providing path.

In particular embodiments, the current detection circuit can include a comparator circuit that is configured to compare a voltage drop across the power circuit path to a voltage drop across the sense circuit path and, in response to the comparison, provide a data signal to an output of the current detection circuit.

Various embodiments are directed toward the use of two different current paths that have respective sets of components that are each manufactured to have matched PVT variation effects between the two different current paths. Moreover, the paths can use different component values while still having matched PVT variation effects. This can be accomplished by carefully selecting the component values so as to have a desired ratio between the component values and by setting a comparison point that is based upon this ratio.

Turning now to the figures, FIG. 1 depicts a block diagram of a system that includes an IC chip for detecting current levels, consistent with embodiments of the present disclosure. IC chip 102 can be configured to receive power from an external power source 104. According to various embodiments, this power source 104 can be a Universal Serial Bus (USB) compliant power source, including but not limited to, a Type-C USB compliant power source. For ease of discussion, the system depicted in FIG. 1 is discussed relative to USB Type-C; however, the IC chip can be designed for use with other protocols in various embodiments.

Consistent with embodiments of the present disclosure, the IC chip 102 can be configured to function as a power switch that is used for USB power delivery (PD), battery charging (BC), and USB type-C products. In order to prevent excessive current through the power switch circuit 106 from damaging the power load 108, the power source 104, or the power switch circuit 106, a current detection circuit 110 can be used to help control the amount of power provided by power switch 106. The sensed current data can be provided to processing logic circuit 112. In some embodiments, processing logic circuit 112 can be configured to communicate with external devices over secondary communication link or bus, such as over an Inter-Integrated Circuit (I2C) bus. Processing logic can also control the operation of the power switch circuit 106 and configure and calibrate the current detection circuit 110, as is discussed in more detail herein.

Various embodiments are directed toward a low cost, high integration level, and high accuracy in the design of the current detection circuit 110 and the corresponding IC chip 102. For instance, the current detection circuit can be configured to provide accurate current detection without using an external resistive element that has a high precision and that might require an additional input pin of the IC chip 102. Embodiments of the present disclosure are directed toward a current detection circuit 110 that is configured to detect current through the power switch 106 without the use of such an external resistive element. In particular embodiments, the IC chip 102 can be created without the use of costly semiconductor manufacturing processes that can be used to improve component tolerances and reduce component PVT variation effects. For instance, the current detection circuit can utilize a sense current path as a reference point for detecting current through the power current path. The sense current path can be configured to match PVT variation effects of the power current path. In this manner, the reference point used by the current detection circuit 110 will naturally shift with PVT variation effects and can effectively cancel out PVT variation effects corresponding to the power current path.

According to particular embodiments, the components in both the sense current path and the power current path can be manufactured during the same steps of a semiconductor manufacturing process and also be located in close physical proximity to one another. The use of the same processing steps and similar physical location can help to closely match the PVT variation effects for components in each path.

In various embodiments, the power switch circuit can include a power transistor that, when activated, is supplied with a bias voltage (Vbias) that can be produced by a voltage bias generator circuit 114 (e.g., a bandgap or other type of circuit). To account for PVT variation effects related to the power transistor, the current sense path can also include a transistor that is similarly biased. The current detection circuit 110 can detect a voltage drop through each of the current paths and compare the voltage drops as part of detecting the current through the power current path. As each of the paths is expected to have similar PVT variation effects, the comparison provides compensation for the PVT variation effects.

According to certain embodiments, the processing logic can be configured to adjust the reference point provided by the current sense path. For example, the current sense path can include a variable current source. The processing logic 112 can receive a command (e.g., through the I2C interface) that specifies a desired current level. In response to the command, the processing logic 112 can adjust the amount of current provided by the current source, thereby, changing the voltage drop seen across components in the current sense path.

Figure 2:
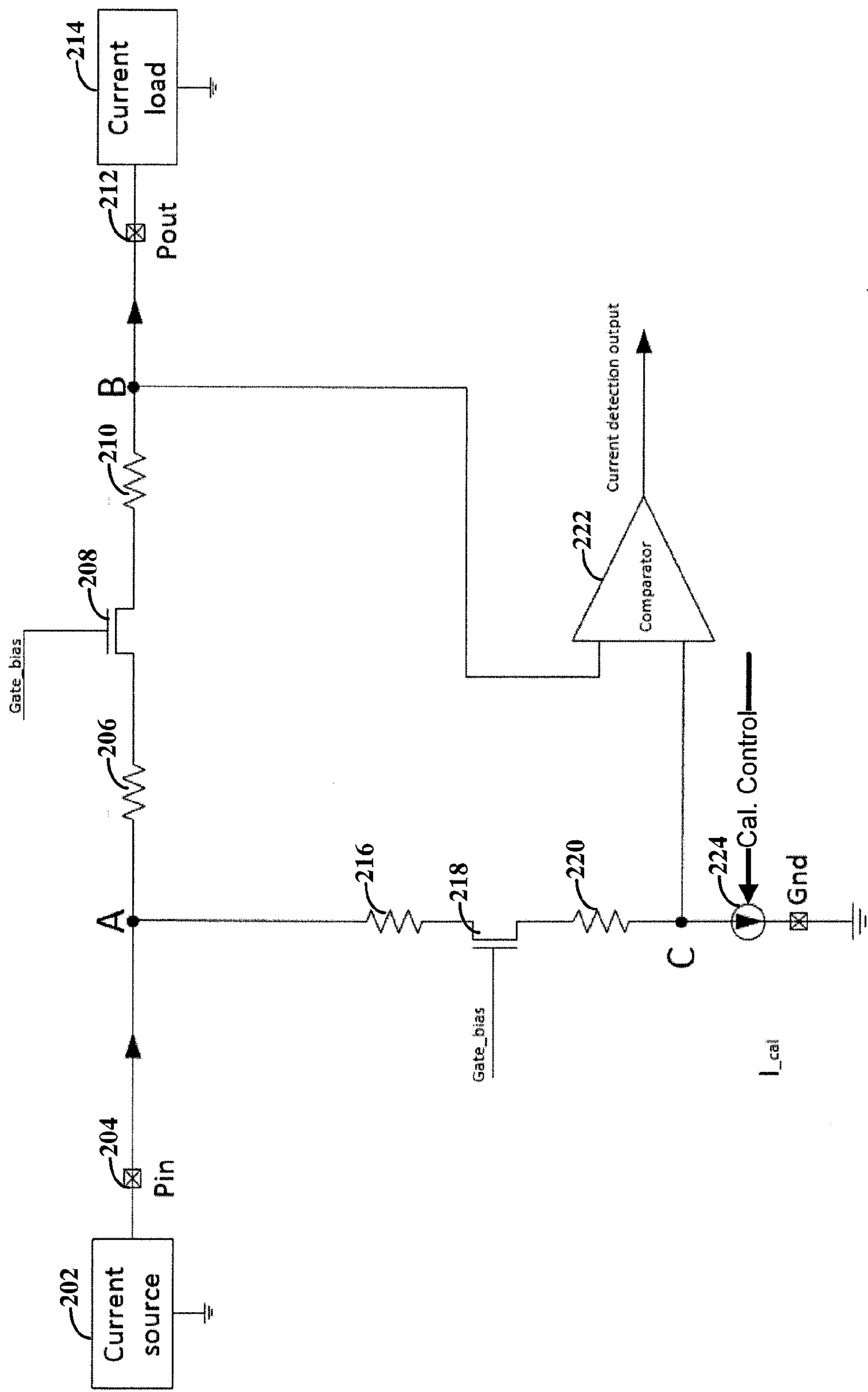
FIG. 2 depicts a circuit diagram for an IC chip for detecting current levels, consistent with embodiments of the present disclosure.

FIG. 2 depicts a circuit diagram for an IC chip for detecting current levels, consistent with embodiments of the present disclosure. Current (power) source 202 can connect to the IC chip through a connection pin, pad, or similar chip I/O interface, as indicated by 204. The received power (Pin) can be sent through a power current path that includes a transistor-based power switch 208 and services as a switch control for power provided to an output indicated by 212. The output power (Pout) can then be sourced by a current load 214. The power current path can include conductive (metallic) traces that connect the power switch 208 to each of the input and output pins 204, 212, respectively. The resistive symbols identified as 206 and 210 represent the components (e.g., conductive traces) that provide resistance between pins 204, 212 and the power switch 208.

A current sense path can include a transistor-based sense switch 218. Conductive traces 216 and 220 can connect the sense switch 218 the input pin 204 and a current source 224, respectively. Comparator 222 can be configured to compare the voltage at nodes B and C to provide a current detection output.

As discussed herein, the components in the current sense path and the power current path can be designed on the same substrate using the same technology (e.g. complementary metal-oxide semiconductor (CMOS) technology). As shown in the following figure, when the power switch 208 is turned on, power current (I_power) passes through the power switch from the current source to load. When passing from node A to node B, the current passes through resistive components (e.g., conductive traces) 206 and 210 and through power switch 208. In some implementations, the resistive components 206 and 208 can have a similar resistive value (R_metal). The on resistance of the power switch 208 can be represented by Ron. The voltage drop from Node A to B (V_AB) can be represented by the equation:

$$V\_AB=I\_\text{power}*(R\_\text{metal}+R\text{on}+R\_\text{metal})$$

In the current detection circuit, a calibrated current, I_cal, which is available from another part of the same chip, passes through the matching resistive components (e.g., conductive traces) 216, 218, and sense transistor(s) 218. Using the term "match" to denote the values for the sense current path, the voltage drop from Node A to C is represented by the equation:

$$V\_AC=I\_cal*(R\_\text{metal\_match}+R\text{on\_match}+R\_\text{metal\_match})$$

The voltage comparator 222 can be designed to compare V_AB to V_AC. At the trip point of the comparator, V_AB=V_AC. Therefore, the current at which the comparator is set to trip is represented by the equation:

$$I\_\text{power}=I\_cal*(R\_\text{metal\_match}+R\text{on\_match}+R\_\text{metal\_match})/(R\_\text{metal}+R\text{on}+R\_\text{metal})$$

In various designs, across PVT, the variation of the matching metal resistance follows the variation of the power switch parasitic metal resistance. Similarly, the variation of the matching transistor turn-on resistance can follow the variation of the transistor turn-on resistance of the power switch. Therefore, from the previous equation, the ratio between the current and sense path resistance values (R_metal_match+Ron_match+R_metal_match)/(R_metal+Ron+R_metal) becomes a constant over PVT variation effects.

According to various embodiments, it is recognized that the current source 224 can be configured to provide relatively high accuracy without correspondingly high costs (e.g., relative to using a precision resistor). For instance, the accuracy of I_cal can be readily controlled to within 3% of a desired level. Therefore, I_power can be detected with relatively high accuracy.

Aspects of the present disclosure are based upon the recognition that the variation of metal resistance may not follow the variation of the transistor turn-on resistance. Thus, to have (R_metal_match+Ron_match+R_metal_match)/(R_metal+Ron+R_metal) be a constant value, the following equation would first be satisfied:

$$(R\_\text{metal\_match}+R\_\text{metal\_match})/R\text{on\_match}=(R\_\text{metal}+R\_\text{metal})/R\text{on}$$

It is further recognized that a number of additional factors can have an effect on the accuracy of the current detection. These factors can include, but are not necessarily limited to, a mismatch between the matching metal and the parasitic metal resistance of the power switch, a mismatch between the matching transistor and the power switch transistor, and an offset of the comparator. A number of factors can contribute to reducing the effects of these mismatches including, but not necessarily limited to, the placement of the power switch and the current detection on the same chip, the same substrate, and in close proximity to one another on the chip, and also the relatively large size of the power switch. And with careful design of the comparator and the current source circuit that provides I_cal, accuracy of the current detection can be improved.

Figure 3:
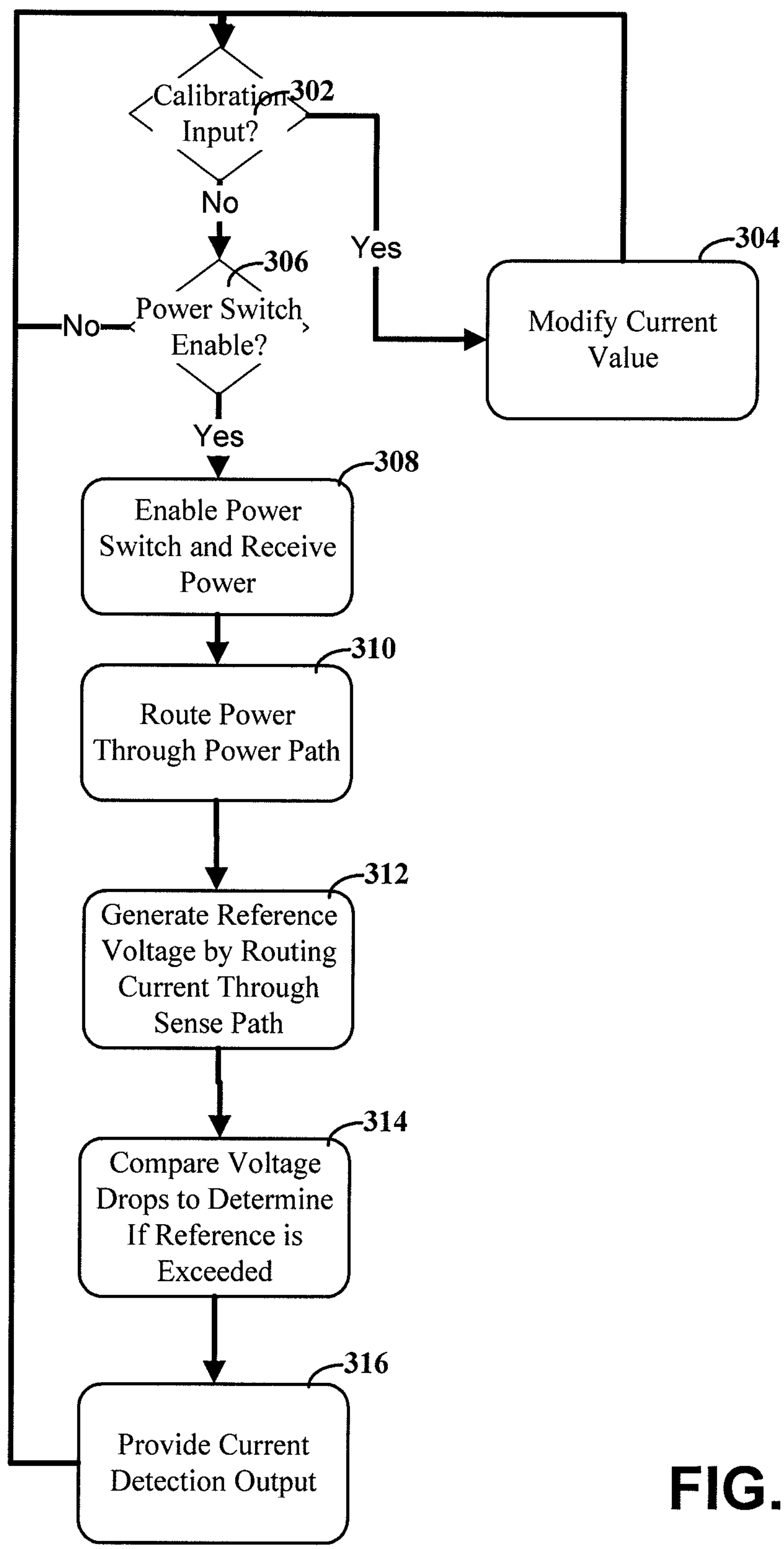
FIG. 3 depicts a flow diagram for use with an IC chip that detects current levels, consistent with embodiments of the present disclosure.

FIG. 3 depicts a flow diagram for use with an IC chip that detects current levels, consistent with embodiments of the present disclosure. In various embodiments, the IC chip can include processing logic that can allow the current value of the sense path to be adjusted through a calibration process, as depicted by the decision block 302. Calibration of the current can occur upon initialization of the IC chip or in response to a subsequent calibration request (e.g., received from a processor of an SoC device over an I2C interface). If there is calibration input, then the current value for the current source of the sense path can be modified, per block 304.

Various embodiments allow for the power switch to be selective enabled and disabled in response to an enable signal or command, per decision block 306. If no enable signal is received, then there is virtually no power and the process can continue to monitor for calibration input or enabling of the power switch, per blocks 302 and 306, respectively. If the power switch enable signal is received, then the IC chip can enable the power switch so that it can receive power from a power source, per block 308. The receive power can be routed through the power path to a load, per block 310.

As discussed herein, a reference voltage can be generated by routing current through a sense current path, as shown by block 312. In some embodiments, the current can be routed at any time (e.g., not just when the power switch is enabled) because the current draw is relatively low. Various embodiments also allow for the transistor switch of the current to be disabled when the power switch is disabled.

A comparator circuit can be used to compare the voltage drops across the power current path and the sense current path, per block 314. The result of the comparison can then be provided as an output of the current detection circuit, per block 316. For example, the current detection and power switch circuits can be part of an SoC. The output of the comparator may be indicative of an overcurrent condition and it can be provided a processor circuit of the SoC, which can take appropriate action (e.g., reduce the current draw of the load, or disable the power switch).

Though aspects and features may in some cases be described in individual figures, it will be appreciated that features from one figure can be combined with features of another figure even though the combination is not explicitly shown or explicitly described as a combination.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, an apparatus can be designed for use with different interfaces, protocols, and configurations than USB Type-C. Such modifications do not depart from the true spirit and scope of various aspects of the invention, including aspects set forth in the claims.

What is claimed is:

1. A system for providing current detection in an integrated circuit (IC) chip while compensating for variations in circuit components resulting from process, voltage supply, temperature, or combinations thereof, the system comprising:

the IC chip including:

a power switch circuit that includes a power circuit path including a first transistor connected to:

a power source through a first conductive trace that has a first resistance value, and a load through a second conductive trace having a second resistance value; and a current detection circuit configured to compensate for the variations in the power switch circuit, the current detection circuit including:

a current source circuit, a sense circuit path that is configured to match process, voltage supply, and temperature variations in the power circuit path, the sense circuit path including a second transistor connected to the power source by a third conductive trace having a third resistance value and to the current source circuit by a fourth conductive trace having a fourth resistance value, and a comparator circuit configured to compare a voltage drop across the power circuit path to a voltage drop across the sense circuit path and, in response to the comparison, provide a data signal to an output of the current detection circuit.

2. The system of claim 1, wherein the third and fourth resistance values are different from the first and second resistance values, respectively.

3. The system of claim 1, wherein the third and fourth conductive traces are thinner than the first and second conductive traces, respectively.

4. The system of claim 1, wherein the first transistor has an on resistance that is less than an on resistance of the second transistor.

5. The system of claim 4, wherein a bias voltage is connected to gates of both the first and second transistors.

6. The system of claim 1, wherein the data signal indicates that current through the power circuit path exceeds a threshold current level.

7. The system of claim 6, wherein the current detection circuit is configured to adjust the threshold current level in response to an input signal.

8. The system of claim 6, wherein the current detection circuit is configured to adjust the threshold current level in response to an input signal by changing an amount of current sourced by the current source circuit.

9. The system of claim 1, wherein the first transistor is configured with first on-resistance value and the second transistor is configured with a second on-resistance value and wherein a ratio of the first and second resistance values to the first on-resistance value is substantially equal to a ratio of the third and fourth resistance values to the second on-resistance value.

10. The system of claim 1, wherein the current detection circuit, and the power switch circuit are located on a single integrated circuit (IC) die.

11. A method for providing current detection in an integrated circuit (IC) chip while compensating for variations in circuit components resulting from manufacturing of the IC chip, the method comprising:

receiving power from a power source;

routing the power through a power switch circuit that includes a power circuit path that includes a first transistor connected to the power source by a first conductive trace having a first resistance value and to a load by a second conductive trace having a second resistance value;

generating a reference voltage by routing current from a current source circuit through a sense circuit path that is configured to match at least one component variation selected from the group consisting of process variation, supply voltage variation and temperature variation for components in the power circuit path and that includes a second transistor connected to the power source by a third conductive trace having a third resistance value and to the current source circuit by a fourth conductive trace having a fourth resistance value;

comparing a voltage drop across the power circuit path to a voltage drop across the sense circuit path using a comparator circuit; and providing, in response to the comparing, a data signal that indicates a current level through the power circuit path.

12. The method of claim 11, further comprising receiving an adjustment data signal and changing, in response to the adjustment data signal, an amount of current sourced by the current source circuit.

13. The method of claim 11, wherein the third and fourth resistance values are different from the first and second resistance values, respectively.

14. The method of claim 11, further comprising providing a bias voltage to gates of both the first and second transistors.

15. The method of claim 11, wherein the first transistor is configured with a first on-resistance value and the second transistor is configured with a second on-resistance value and wherein a ratio of the first and second resistance values to the first on-resistance value is substantially equal to a ratio of the third and fourth resistance values to the second on-resistance value.

16. The method of claim 11, wherein components of the sense circuit path and components of the power circuit path are manufactured as part of the same manufacturing step and in close physical proximity on a substrate of the IC chip.

17. Integrated circuit (IC) current detection apparatus, comprising:

a power switch circuit having a power circuit path including a first transistor configured to be connected to a power source through a first conductive trace;

wherein the first conductive trace includes a first resistance value;

wherein the first transistor is configured to be connected to a load through a second conductive trace;

wherein the second conductive trace includes a second resistance value; and a current detection circuit having, a current source circuit, a sense circuit path that is configured to match either process, voltage supply or temperature variations in the power circuit path;

wherein the sense circuit path includes a second transistor configured to be connected to the power source by a third conductive trace having a third resistance value and to the current source circuit by a fourth conductive trace having a fourth resistance value; and a comparator circuit configured to compare a voltage drop across the power circuit path to a voltage drop across the sense circuit path and, in response to the comparison, provide a data signal to an output of the current detection circuit.

* * * * *